(12) United States Patent
Kim

(10) Patent No.: US 7,767,592 B2
(45) Date of Patent: Aug. 3, 2010

(54) METHOD FOR FORMING A MASK PATTERN FOR ION-IMPLANTATION

(75) Inventor: Kyu Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 597 days.

(21) Appl. No.: 11/382,485

(22) Filed: May 10, 2006

(65) Prior Publication Data
US 2007/0152305 A1    Jul. 5, 2007

(30) Foreign Application Priority Data
Dec. 30, 2005    (KR) .................... 10-2005-0135279

(51) Int. Cl.
*H01L 21/31*    (2006.01)
*H01L 21/469*    (2006.01)

(52) U.S. Cl. .............................. 438/781; 257/E21.023; 257/E21.027; 438/421; 438/619; 438/725; 438/780; 438/948; 438/950

(58) Field of Classification Search .......... 257/E21.023; 438/781, 782
See application file for complete search history.

(56) References Cited

U.S. PATENT DOCUMENTS

| | | | | |
|---|---|---|---|---|
| 6,096,656 A | * | 8/2000 | Matzke et al. | 438/702 |
| 6,251,569 B1 | * | 6/2001 | Angelopoulos et al. | 430/325 |
| 6,326,269 B1 | * | 12/2001 | Jeng et al. | 438/278 |
| 7,270,939 B2 | * | 9/2007 | Juan et al. | 430/285.1 |
| 2003/0003714 A1 | | 1/2003 | Lee et al. | |
| 2004/0072108 A1 | | 4/2004 | Hyon | |
| 2005/0221558 A1 | | 10/2005 | Lee | |
| 2005/0260528 A1 | | 11/2005 | Kong et al. | |

FOREIGN PATENT DOCUMENTS

| | | |
|---|---|---|
| TW | 550743 | 9/2003 |
| TW | 561559 | 11/2003 |

* cited by examiner

*Primary Examiner*—Matthew C Landau
*Assistant Examiner*—Vicki B Booker
(74) *Attorney, Agent, or Firm*—Townsend and Townsend and Crew LLP

(57) ABSTRACT

A method for forming a mask pattern for ion-implantation comprises: forming a gate line pattern over a semiconductor substrate; forming a coating layer on the surface of gate line pattern; performing a plasma treatment on the top portion of the gate line pattern; forming a photoresist layer over the resulting structure; and performing an exposure and a developing processes to form a photoresist pattern on the gate line pattern.

6 Claims, 6 Drawing Sheets

METHOD FOR FORMING A MASK PATTERN FOR ION-IMPLANTATION

BACKGROUND OF THE INVENTION

The present invention generally relates to a method for forming a mask pattern for ion-implantation. More specifically, the disclosure relates to a method comprising forming a coating film having a lower interfacial tension than that of a photoresist on the surface of a gate line pattern and forming a photoresist mask pattern for ion-implantation thereon to perform a subsequent ion-implanting process stably.

As the fields of application of memory devices have been extended, a manufacturing technology of semiconductor device has been urgently requested to manufacture a memory device of high capacity with improved integrity and without degradation of electric characteristics. As a result, a multilateral research to improve a photolithography processes, cell structures, and physical property limits of materials which form wires and insulating films have been made.

Meanwhile, an ion-implanting process is essentially applied to form the memory devices having electric characteristics, stably performing the ion-implanting process improves the final yield of semiconductor devices.

FIGS. 1a through 1d are diagrams illustrating a conventional method for performing ion-implantation process.

Referring to FIG. 1a, a gate material layer (not shown) is formed over a semiconductor substrate 1 including an isolation film (not shown) and then a photolithography and etch process is sequentially performed on the resulting structure to form a gate line pattern 3.

A photoresist layer 5 is formed on the resulting structure including the gate line pattern 3, as shown in FIG. 1b, so as to fill the gate line pattern 3 of FIG. 1a.

Thereafter, an exposure and developing process are performed on the photoresist layer 5 of FIG. 1b with an exposure mask for ion-implantation to form a photoresist pattern 5-1 as shown in FIG. 1c. A bit-line contact (BLC) node region 11 where a ion-implanting region is to be formed is opened at a predetermined width(a) and a storage node contact (SNC) node region 13 where a ion-implanting region is not to be formed is filled at a predetermined height(b) so that the photoresist pattern 5-1 may be used as a mask for ion-implantation in a subsequent ion-implanting process.

Then, the ion-implanting process 7 is performed with the photoresist pattern 5-1 as a mask pattern for ion-implantation (see FIG. 1d).

However, the conventional method for performing ion-implantation process has the following problems.

Since the aspect ratio of the gate line pattern increases by decreasing a pattern critical dimension (hereinafter, referred to as "CD") of a semiconductor device, the lower part of the gate line pattern is not sufficiently exposed to an light source during the exposure process. As a result, a photoresist material 9 remains in the BLC node region 11 as shown in FIG. 1c even after the developing process is completed. Moreover, when the gate line pattern is non-uniformly filled using the photoresist material, voids (not shown) are generated.

In order to remove the residual photoresist material, a descum process which is an etch-back process is performed on the final resulting structure, and the width size (a') of the upper part of the photoresist pattern of the BLC node region 11 is enlarged and the height (b') of the photoresist pattern of the SNC node region 13 is reduced as shown in FIG. 1d. As a result, since the photoresist pattern of the SNC node region 13 does not have the enough thickness to serve as a barrier in the subsequent ion-implanting process as shown in FIG. 1d, even a region having no ion-implanting region is damaged during the ion-implanting process.

When an ultra-fine pattern having a high aspect ratio is formed with an exposer having a high lens numerical aperture (hereinafter, referred to as "NA"), the damage is more severe, thereby reducing the manufacture yield of the final semiconductor device.

BRIEF SUMMARY OF THE INVENTION

Various embodiments of the present invention are directed to providing a method for forming a mask pattern for ion-implantation, which comprises forming a coating film on the surface of a gate line pattern over a photoresist pattern which is a mask pattern for ion-implantation is formed, thereby improving reliability.

According to an embodiment of the present invention, a method for forming a mask pattern for ion-implantation comprises: forming a gate line pattern over a semiconductor substrate; forming a coating film on the surface of the gate line pattern; performing a plasma treatment on the top portion of the gate line pattern; forming a photoresist layer over the resulting structure; and performing an exposure and a developing processes to form a photoresist pattern on the gate line pattern, wherein the interfacial tension of the coating film is lower than that of the photoresist layer.

BRIEF DESCRIPTION OF THE DRAWINGS

For a more complete understanding of the invention, reference should be made to the following detailed description and accompanying drawings.

DETAILED DESCRIPTION OF THE INVENTION

The present invention will be described in detail with reference to the accompanying drawings (FIGS. 2a through 2e).

Figure 1A:
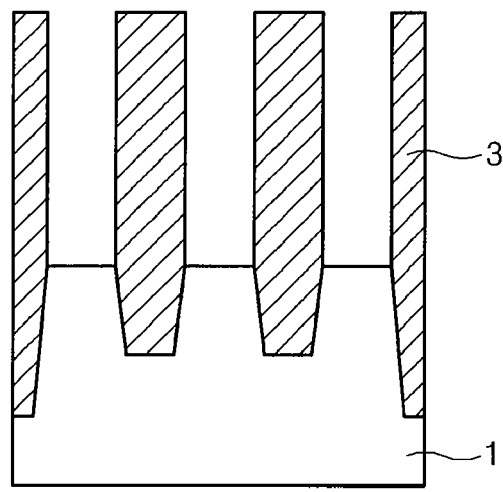
FIGS. 1a through 1d are diagrams illustrating a conventional method for performing ion-implantation process.
Figure 1B:
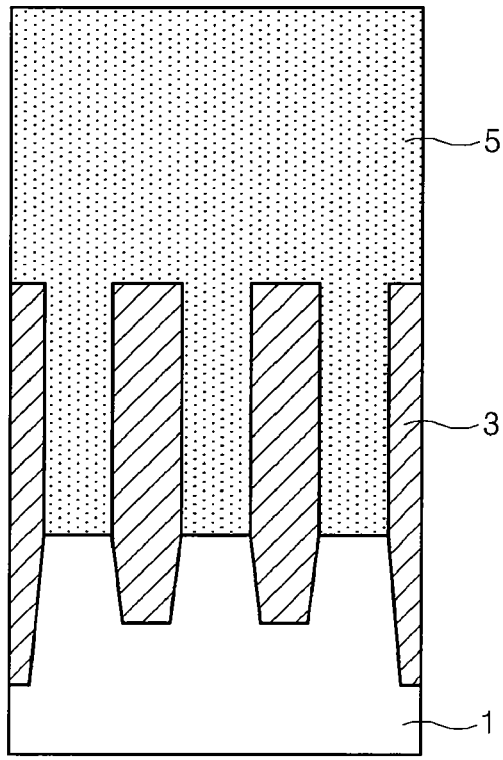
Figure 1C:
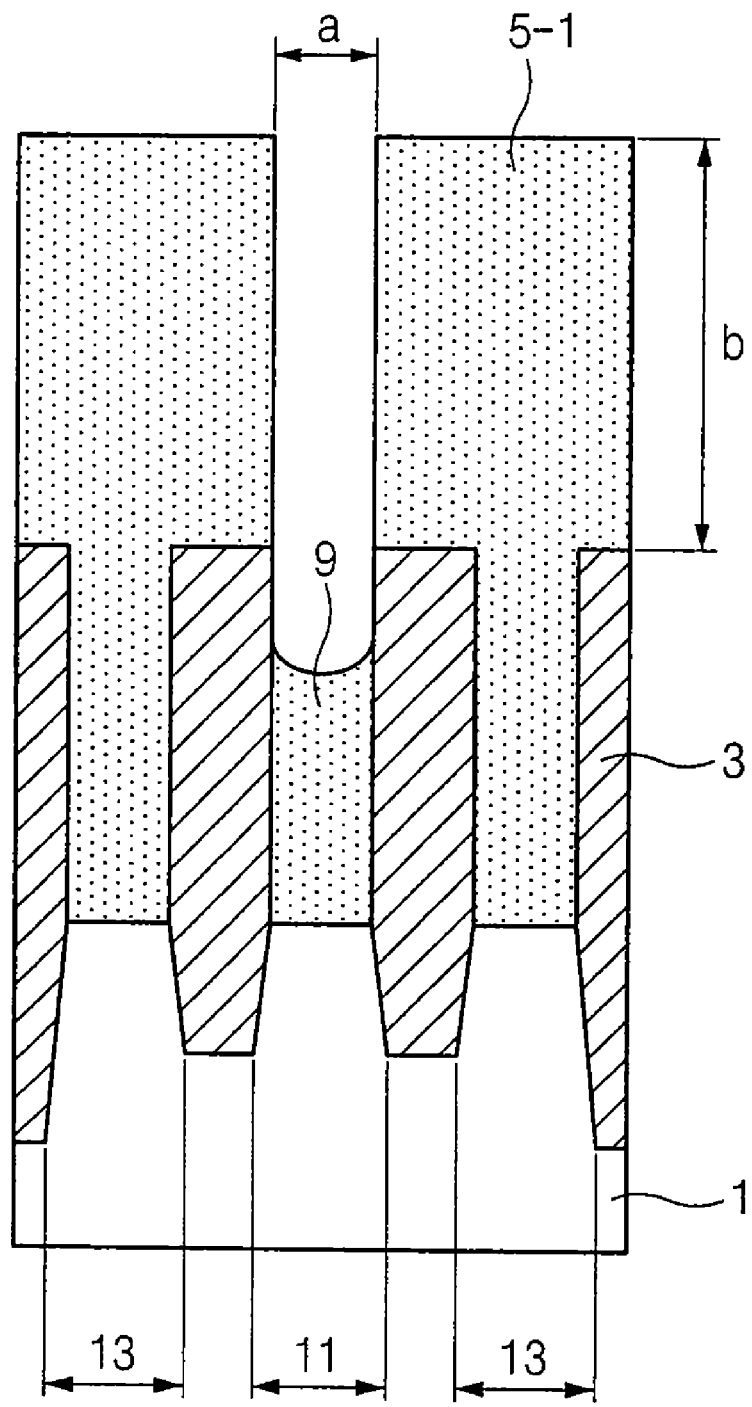
Figure 1D:
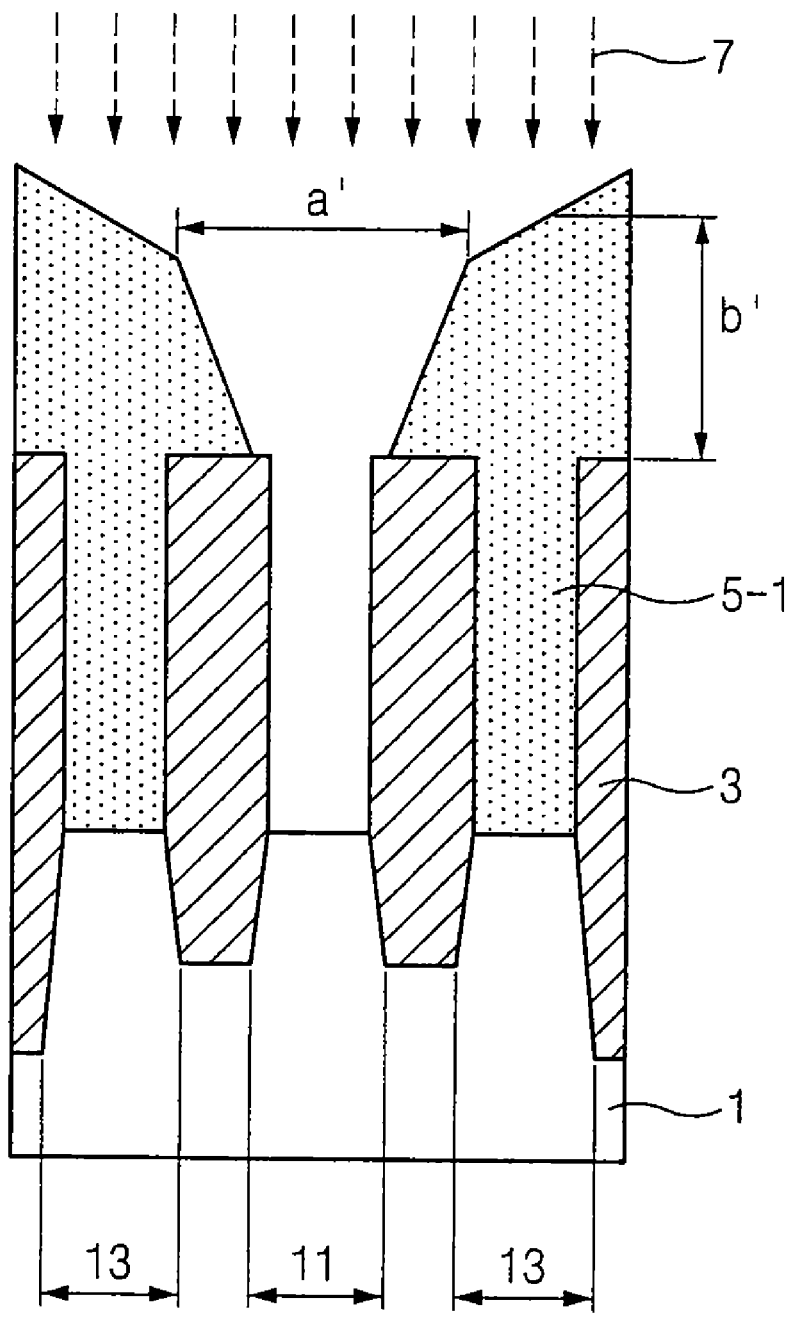
Figure 2A:
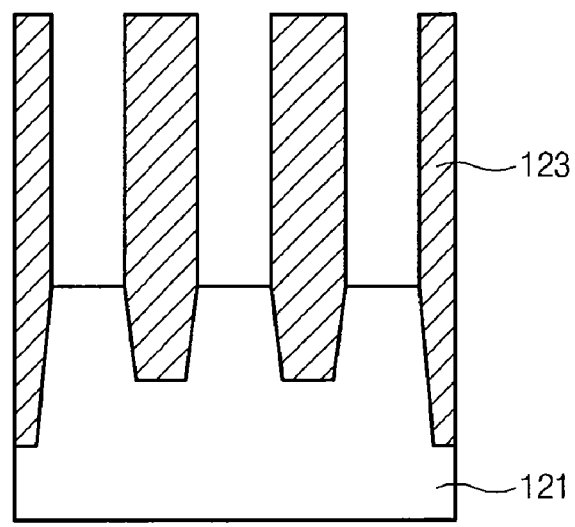
FIGS. 2a through 2e are diagrams illustrating a method for performing ion-implantation process according to an embodiment of the present invention.

Referring to FIG. 2a, a gate line pattern 123 is formed over a semiconductor substrate 121 including an isolation film.

The gate line pattern 123 is obtained by performing a conventional Vt screen oxidation process and a well/channel forming process, sequentially depositing a gate oxide film (not shown), a doped silicon layer (not shown), a tungsten silicide film (not shown) and a gate hard mask layer (not shown) and then pattering the layers.

Figure 2B:
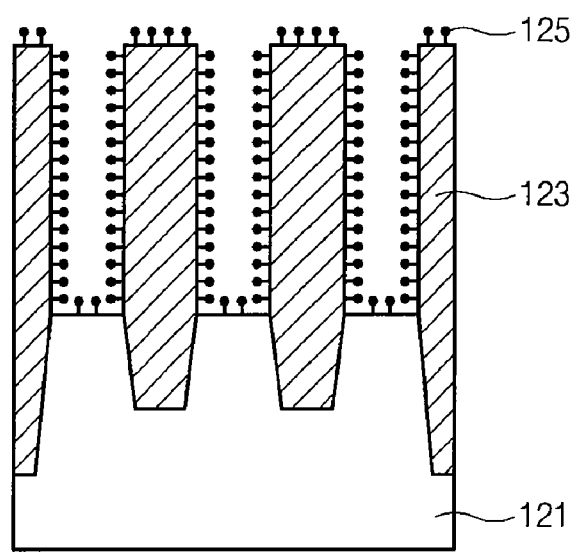

As shown in FIG. 2b, a coating film 125 is formed over the entire surface of the resulting structure including the gate line pattern 123.

The interfacial tension of the coating film is lower than that of a photoresist layer. In some embodiments, the coating film comprises a hydrophilic compound when the photoresist material is hydrophobic. For example, the coating film comprises the compound with a lower interfacial tension selected from the group consisting of hydroxyethyl methacrylate, N-vinyl-2-pyrrolidone, methacrylic acid, acrylamide and oligomers thereof.

The coating film is formed by using: i) a method comprising dissolving the compound having a lower interfacial tension in an organic solvent or an aqueous solvent; and immersing the semiconductor substrate which the gate line pattern is formed in the solution or ii) a method for supplying the compound in a gas state into a vacuum chamber in which the semiconductor substrate is located so that the coating film is formed a self-assemble monolayer (hereinafter, referred to as "SAM").

Figure 2C:
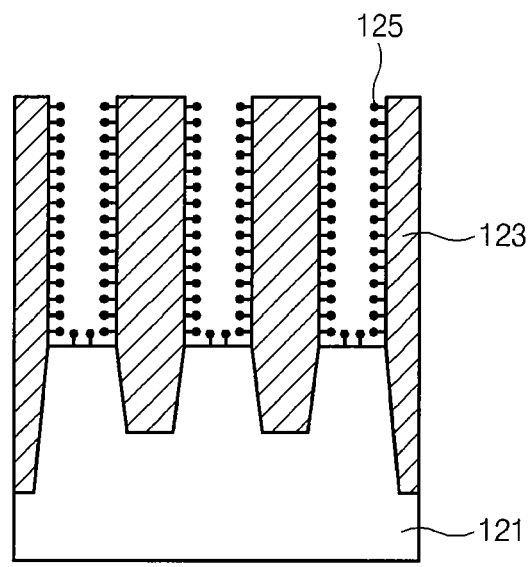

Thereafter, the top portion of the resulting structure is treated using gas plasma such as an $O_2$ plasma gas to remove only the coating film 125 of the top surface of the gate line pattern 123 as shown in FIG. 2c. Since the side surfaces of the gate line patterns 123 are less affected by plasma than the top portion of the gate line patterns 123, the coating film 125 on the side surfaces of the gate line patterns 123 remains thereon.

When a photoresist layer 127 is formed on the entire surface of the resulting structure of FIG. 2c, the photoresist layer 127 is not filled in the regions between the gate line patterns 123 by an interfacial tension difference of the coating film 125 and the photoresist layer. As a result, the photoresist layer 127 is formed only on the top portion of the gate line pattern 123, and a vacant space 129 remains between the gate line patterns 123 as shown in FIG. 2d.

Figure 2D:
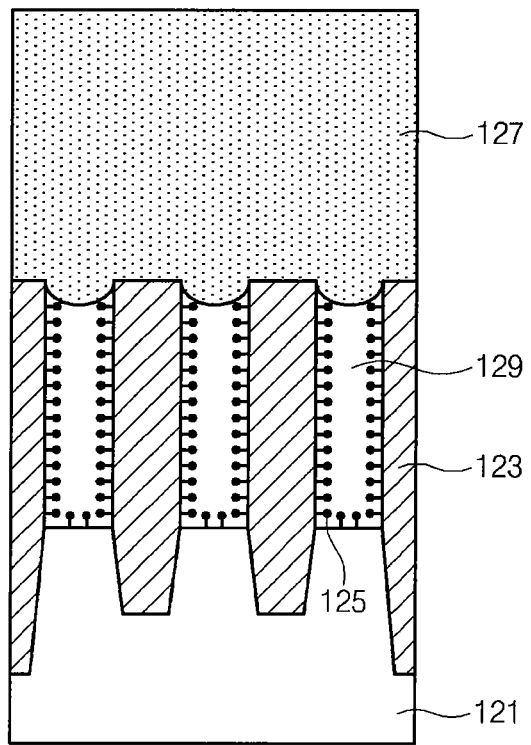
Figure 2E:
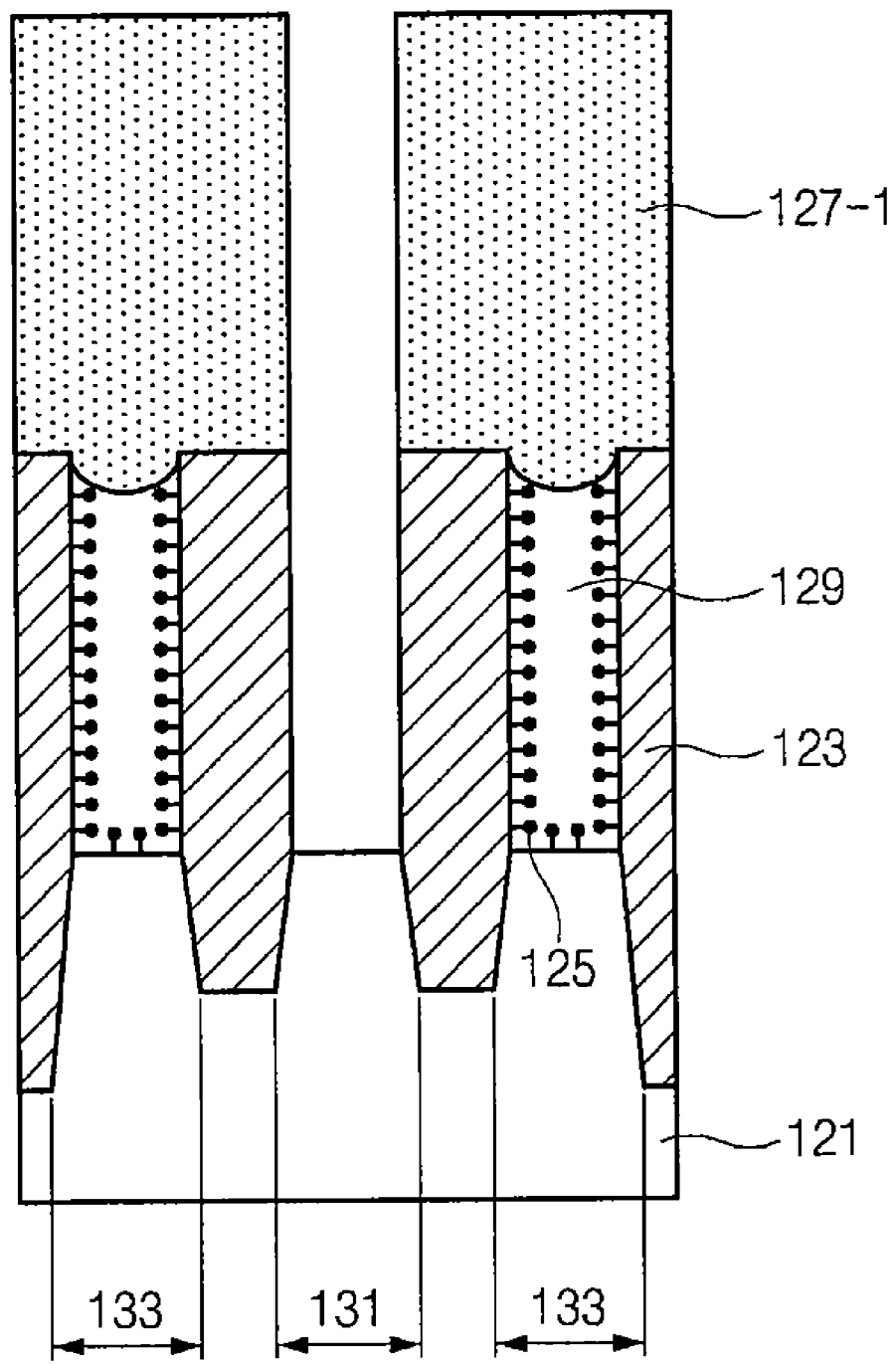

An exposure and developing process is performed on the photoresist layer 127 of FIG. 2d to form a photoresist pattern 127-1 as shown in FIG. 2e. During the developing process, the coating film 125 in an open BLC node region 131 is also removed, but the coating film 125 in an SNC node region 133 is not removed.

Since the photoresist layer 127 is not filled between the gate line patterns 123, no photoresist residuals remain in BLC node region 131 after the developing process. As a result, since the conventional descum process dose not apply, a stable mask pattern for ion-implantation is formed without damage of the photoresist pattern.

As mentioned above, the compound having a different physical property different from that of the photoresist layer is coated on the surface of the gate line pattern, thereby preventing the photoresist layer from being filled between the gate line pattern and also remaining in the BLC region after the photoresist pattern is formed.

Since the descum process that has been necessarily performed to remove the photoresist residuals between the gate line patterns can be omitted so as to obtain a mask pattern having an enough thickness to be used as a mask for ion-implantation process, a subsequent ion-implanting process may be safely performed. As a result, the manufacturing cost of semiconductor devices can be reduced.

Additionally, there is provided a semiconductor device manufactured by the above-described method.

As described above, a mask pattern for ion-implantation can be obtained with a method according to an embodiment of the present invention, so that a subsequent ion-implanting process is stably performed to improve the final yield of semiconductor devices.

While the present invention has been described with respect to certain embodiments, it will be apparent to those skilled in the art that various changes and modifications may be made without departing from the spirit and scope of the invention as defined in the following claims.

What is claimed is:

1. A method for forming a mask pattern for ion-implantation, comprising:
    forming gate line patterns over a semiconductor substrate;
    forming a coating film on sidewalls of the gate line patterns and the semiconductor substrate exposed between the gate line patterns, wherein the coating film comprises a hydrophilic compound selected from the group consisting of hydroxyethyl methacrylate, N-vinyl-2-pyrrolidone, methacrylic acid, acrylamide, and oligomers thereof;
    forming a photoresist layer over the gate line patterns, wherein a space is formed between adjacent gate line patterns, below the photoresist layer and above the semiconductor substrate; and
    performing an exposure process and a developing process on the photoresist layer between adjacent gate line patterns to remove the photoresist layer above the space and to expose an ion-implanting region of the semiconductor substrate, wherein one sidewall of each gate line pattern is exposed by the exposure process such that a bridged photoresist pattern is formed over each pair of adjacent gate line patterns over the non-exposed sidewalls thereof.

2. The method according to claim 1, wherein photoresist layer comprises a hydrophobic compound.

3. The method according to claim 1, wherein forming the coating film further comprises:
    i) providing a solution by dissolving the hydrophilic compound with a lower interfacial tension than that of the photoresist in an organic solvent or an aqueous solvent;
    ii) forming the coating film on surfaces of the gate line patterns by immersing the semiconductor substrate in the solution; and
    iii) performing a plasma treatment on the gate line patterns to remove the coating film from a top surface of the gate line patterns.

4. The method according to claim 1, wherein forming the coating film further comprises:
    i) arranging the semiconductor substrate with the gate line patterns formed thereon in a vacuum chamber; and
    ii) supplying the hydrophilic compound having a lower interfacial tension than that of the photoresist in a gaseous state into the vacuum chamber, thereby forming the coating film on surfaces of the gate line patterns.

5. The method according to claim 3, wherein the plasma treatment is performed using $O_2$ plasma gas.

6. The method according to claim 1, wherein the developing process removes the coating film from the exposed sidewalls of the gate line patterns.

* * * * *